(12) United States Patent
Satomi

(10) Patent No.: US 8,471,767 B2
(45) Date of Patent: Jun. 25, 2013

(54) RADIO FREQUENCY MULTILAYER SUBSTRATE AND MANUFACTURING METHOD OF RADIO FREQUENCY MULTILAYER SUBSTRATE

(75) Inventor: Akihiro Satomi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 767 days.

(21) Appl. No.: 12/507,290

(22) Filed: Jul. 22, 2009

(65) Prior Publication Data

US 2010/0045537 A1 Feb. 25, 2010

(30) Foreign Application Priority Data

Aug. 20, 2008 (JP) .................................. 2008-211950

(51) Int. Cl.
*H01Q 1/38* (2006.01)
(52) U.S. Cl.
USPC .................................. 343/700 MS; 343/846
(58) Field of Classification Search
USPC ........................................... 343/700 MS, 846
See application file for complete search history.

(56) References Cited

FOREIGN PATENT DOCUMENTS

| JP | 57-117805 | 7/1982 |
| JP | 2003-158381 | 5/2003 |
| JP | 2003-168903 | 6/2003 |
| JP | 2004-320109 | 11/2004 |
| JP | 2006-211070 | 8/2006 |
| JP | 2007-201112 | 8/2007 |

*Primary Examiner* — Dieu H Duong
(74) *Attorney, Agent, or Firm* — Oblon, Spivak, McClelland, Maier & Neustadt, L.L.P.

(57) ABSTRACT

A radio frequency multilayer substrate which has a connection portion connecting a strip line and a microstrip line, of which connection portion improves VSWR, is provided. The high frequency multilayer substrate has a through-hole which electrically connects a central conductor of the strip line and a central conductor of the microstrip line. The high frequency multilayer substrate also has an insulating hole which does not have a conductor inside. The through-hole is connected with the insulating hole. A length of the conductor layer of the through-hole from the central conductor to an insulating hole is smaller than one half the distance from the central conductor to a 2nd ground conductor. The insulating hole can be formed by cutting the through-hole.

2 Claims, 4 Drawing Sheets

PRIOR ART

RADIO FREQUENCY MULTILAYER SUBSTRATE AND MANUFACTURING METHOD OF RADIO FREQUENCY MULTILAYER SUBSTRATE

CROSS REFERENCE TO RELATED APPLICATION

This application is based upon and claims the benefit of priority from Japanese Patent Application No. 2008-211950, filed on Aug. 20, 2008, the entire contents of which are incorporated herein by reference.

FIELD OF THE INVENTION

The present invention relates to a radio frequency multilayer substrate having a connection portion which connects a strip line and a microstrip line, and more specifically relates to the radio frequency multilayer substrate having a connection portion which connects a strip line and a microstrip line in which the VSWR (Voltage Standing Wave Ratio) is improved.

DESCRIPTION OF THE BACKGROUND

In a radio frequency substrate, in order to minimize size and obtain high density, a substrate is multilayered and uses many strip lines of which radio frequency wiring passes inside the substrate. However, when connecting radio frequency wiring with a circuit component or an external device, a microstrip line is used because it is necessary to expose the radio frequency wiring on the substrate. Accordingly, it is necessary to connect the strip line and the microstrip line.

A structure for connecting a strip line and a microstrip line using a through-hole which has a conductor inside is proposed by JP, P2002-190546A.

FIG. 4A is a top view showing a connection portion which connects a strip line and a microstrip line of a radio frequency multilayer substrate using conventional technology. FIG. 4B is a cross-sectional view along III-III line of FIG. 4A.

In radio frequency multilayer substrate 100, strip line 6 has 1st ground conductor 51, 2nd ground conductor 52, central conductor 50, and dielectric layers 61 and 62 provided among conductors 50, 51 and 52.

Microstrip line 8 has dielectric layer 61, central conductor 54 and 3rd ground conductor 55. Conductors 54 and 55 are formed on both sides of dielectric layer 61. Central conductor 54 of microstrip line 8 and 1st ground conductor 51 of strip line 6 are formed on a surface of dielectric layer 61.

Radio frequency multilayer substrate 100 has further dielectric layer 63 in order to form other wiring. In the area shown in FIG. 4B, conductor layer 53, conductor layer 56, and conductor layer 57 are formed. 2nd ground conductor 52 is connected to conductor layer 53 using via-holes 71 and 72, and 3rd ground conductor 55 is connected to conductor layer 56 and conductor layer 57 by via-holes 73 and 74. Radio frequency multilayer substrate 100 is grounded externally by conductor layers 53 and 57.

Central conductor 50 of strip line 6 and central conductor 54 of microstrip line 8 are electrically connected using through-hole 75 which has a conductor inside a penetration hole formed in dielectric layers 61, 62 and 63.

From the reasons of manufacturing process of radio frequency multilayer substrate 100, unlike via-holes 71, 72, 73 and 74, through-hole 75 is formed to penetrate dielectric layers 61, 62 and 63.

A part of the conductor of through-hole 75 located below central conductor 50 is unnecessary to connect central conductor 50 and central conductor 54. This unnecessary conductor part functions as a stub, and produces unnecessary stray capacitance 76.

The unnecessary stray capacitance creates a standing wave which subsequently degrades VSWR.

SUMMARY OF THE INVENTION

A radio frequency multilayer substrate according to an embodiment includes a plurality of laminated dielectric layers; a 1st central conductor provided between said plurality of dielectric layers and having a 1st principal surface and a 2nd principal surface, said 1st principal surface facing a surface of said plurality of laminated dielectric layers; a 1st ground conductor facing said 1st principal surface of said 1st central conductor via said dielectric layer; a 2nd ground conductor facing said 2nd principal surface of said 1st central conductor via said dielectric layer; a 2nd central conductor formed on said surface of said plurality of laminated dielectric layers; a 3rd ground conductor facing said 2nd central conductor formed among said plurality of dielectric layers; a through-hole having a conductor, penetrating said dielectric layer between said 1st central conductor and said 2nd central conductor, and electrically connecting said 1st central conductor and said 2nd central conductor; and an insulating hole connected with said through-hole and formed in said laminated dielectric layer.

A manufacturing method of radio frequency multilayer substrate according to an embodiment includes laminating a plurality of ground conductors, a plurality of dielectric layers, a central conductor of a strip line, and a central conductor of a microstrip line in a multilayer configuration to form a multilayer substrate having said strip line and said microstrip line, in which said central conductor of said microstrip line being located on a surface of said multilayer substrate, and in which said central conductor of said strip line being located in a layer different from said central conductor of a microstrip line; forming a penetration hole penetrating said central conductor of said microstrip line, said central conductor of said microstrip line, and said plurality of laminated dielectric layers; forming a conductor electrically connecting said central conductor of said strip line and said central conductor of said microstrip line in said penetration hole; and forming an insulating hole by cutting and removing said conductor formed in said penetration hole from a surface of said multilayer substrate facing a surface on which said microstrip line is formed, in a range that a tip of said insulating hole does not reach said central conductor of said strip line.

DETAILED DESCRIPTION OF THE INVENTION

Figure 1A:
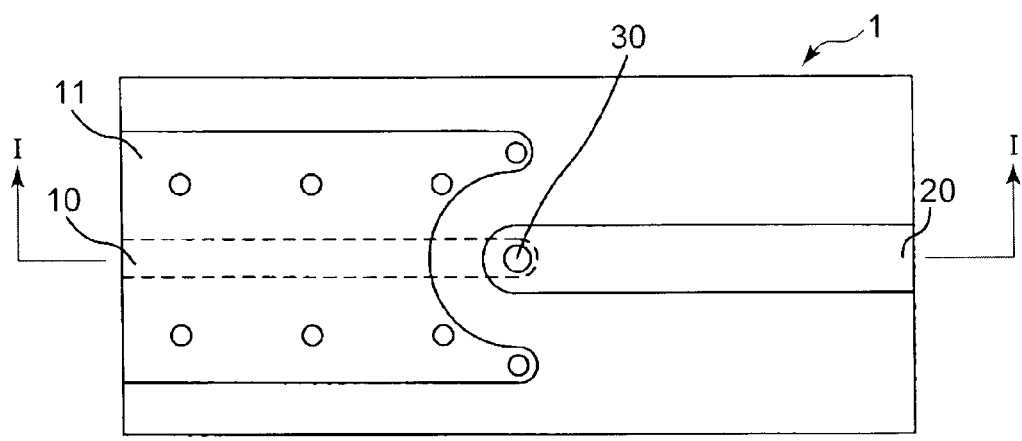
FIG. 1A is a top view of a radio frequency multilayer substrate of an embodiment.
Figure 1B:
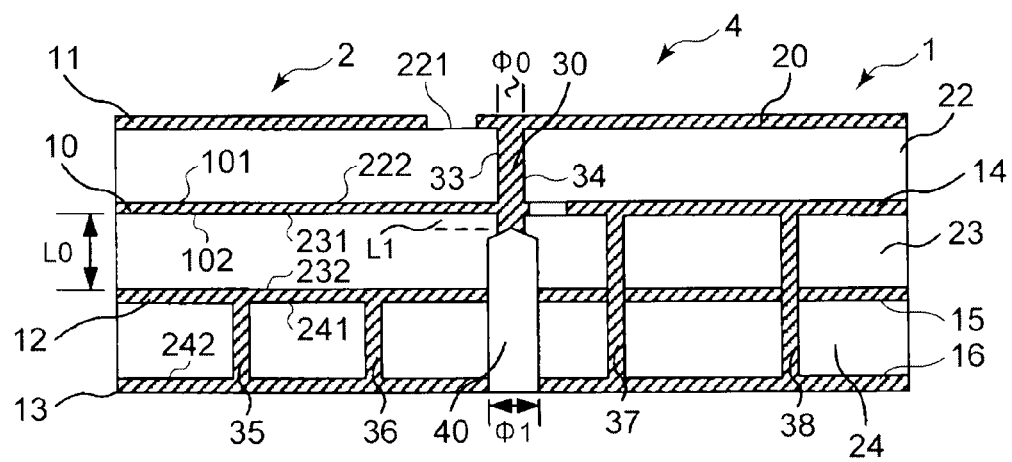
FIG. 1B is a cross-sectional view along I-I line of FIG. 1A.

Hereafter, an embodiment of a radio frequency multilayer substrate according to the present invention is described in detail referencing the drawings. FIG. 1A is a top view of the radio frequency multilayer substrate of this embodiment. FIG. 1B is a cross-sectional view along I-I line in FIG. 1A.

Radio frequency multilayer substrate 1 has dielectric layer 22, dielectric layer 23 and dielectric layer 24, which are laminated via conductors. Dielectric layer 22 has 1st and 2nd principal surfaces 221 and 222 that counter mutually. Dielectric layer 23 has 3rd and 4th principal surfaces 231 and 232 that counter mutually. Dielectric layer 24 has 5th and 6th principal surfaces 241 and 242 that counter mutually. As for dielectric layer 22 and dielectric layer 23, 2nd principal surface 222 and 3rd principal surface 231 face each other. As for dielectric layer 23 and dielectric layer 24, 4th principal surface 232 and 5th principal surface 241 face each other.

Radio frequency multilayer substrate 1 has strip line 2 and microstrip line 4. Strip line 2 has dielectric layer 22, dielectric layer 23, central conductor 10, 1st ground conductor 11 and 2nd ground conductor 12. Central conductor 10 is formed between dielectric layer 22 and dielectric layer 23. 1st ground conductor 11 is formed on 1st principal surface 221 of dielectric layer 22 and counters 1st principal surface 101 of central conductor 10. 2nd ground conductor 12 is formed between dielectric layer 23 and dielectric layer 24 and counters 2nd principal surface 102 of central conductor 10. 1st principal surface 101 of central conductor 10 counters 1st principal surface 221 which is a surface of laminated dielectric layers 22, 23 and 24.

Microstrip line 4 has dielectric layer 22, central conductor 20 and 3rd ground conductor 14. Central conductor 20 is formed on 1st principal surface 221 of dielectric layer 22. 3rd ground conductor 14 is formed between dielectric layer 22 and dielectric layer 22 and counters central conductor 20 via dielectric layer 22. Central conductor 20 is separated from 1st ground conductor 11 so as not to electrically connect with 1st ground conductor 11. Central conductor 20 is formed on the topmost part of the radio frequency multilayer substrate 1, i.e., 1st principal surface 221 of the laminated dielectric layers 22, 23 and 24, in order to be connected with the exterior.

In radio frequency multilayer substrate 1 of the embodiment, in order to form other wiring in an area which is not illustrated, dielectric layer 24 is formed. In order to ground radio frequency multilayer substrate 1 outside, ground conductors 13 and 16 are formed on 6th principal surface 242 of dielectric layer 24. Ground conductor 15 is formed between dielectric layer 23 and dielectric layer 24 in microstrip line 4 side. Ground conductor 12 is connected with ground conductor 13 using via-holes 35 and 36. Ground conductor 14 is connected with ground conductor 15 and ground conductor 16 using via-holes 37 and 38.

In connecting strip line 2 and microstrip line 4, central conductor 10 of strip line 2 and central conductor 20 of microstrip line 4 are electrically connected by conductor 34 of through-hole 30. A through-hole means a hole or a penetration hole which has a conductor inside. Through-hole 30 has penetration hole 33 which penetrates dielectric layers 22, 23 and 24 and conductor 34 provided in penetration hole 33. However, a part of conductor 34 is removed by insulating hole 40 which is mentioned later, and a tip of conductor 34 is located in central conductor 10 side from the middle of central conductor 10 and 2nd ground conductor 12.

Conductor 34 of through-hole 30 is formed on an inner surface of penetration hole 33 by plating of metal, for example. Conductor 34 may not be only the conductor of a film formed on the inner surface of penetration hole 33 but also a conductor pin inserted in penetration hole 33, or both.

Further, radio frequency multilayer substrate 1 has insulating hole 40 which connects with through-hole 30 and does not have a conductor inside.

Insulating hole 40 may be formed by any method. Insulating hole 40 can be created by drilling or cutting a section of through-hole 30 or another method.

Diameter $\phi 1$ of insulating hole 40 is larger than diameter $\phi 0$ of through-hole 30. Conductor 34 of through-hole 30 and dielectric layers 23 and 24 around through-hole 30 are cut together and insulating hole 40 is dug in dielectric layers 23 and 24. If $\phi 1$ is smaller than $\phi 0$, conductor 34 of through-hole 30 cannot be cut and cannot be removed from insulating hole 40.

In forming insulating hole 40, conductor 34 of through-hole 30 is cut from the side of ground conductor 13 and 16 in a range that a tip of insulating hole 40 reaches over the middle of central conductor 10 and 2nd ground conductor 12 but does not reach central conductor 10. That is, conductor 34 is cut to central conductor 10 side rather than the middle of central conductor 10 and said 2nd ground conductor 12.

When being cut in this way, length L1 of conductor 34 from central conductor 10 to insulating hole 40 becomes smaller than one half of the distance L0 from central conductor 10 to 2nd ground conductor 12. If L1 is made larger than one half of L0, unnecessary stray capacitance may occur.

Figure 1C:
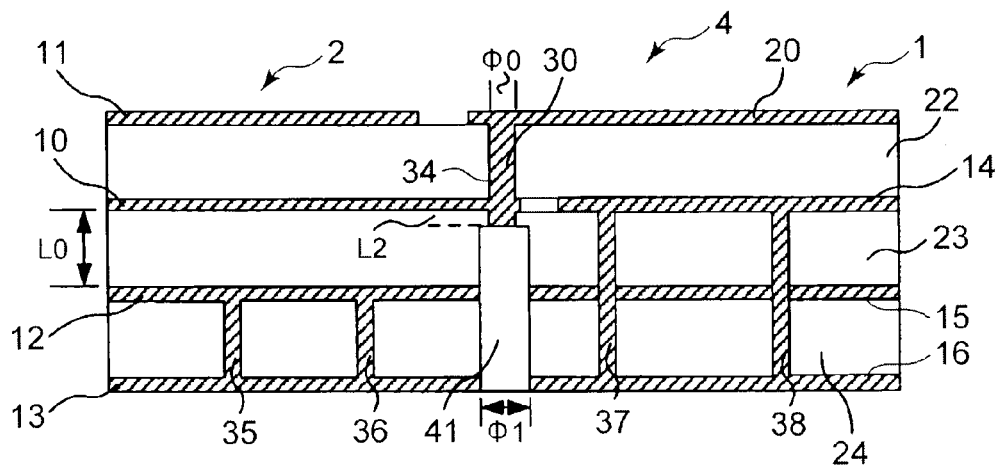
FIG. 1C shows a cross-sectional view showing an example of an insulating hole.

FIG. 1C is a drawing showing insulating hole 41 created by an end mill. The end mill is a kind of a milling cutter and is a cutting tool which has several blades on an outer circumference of a cylindrical shape and with which a cutting end face becomes a plane.

When the end mill is used, an end face of insulating hole 41 becomes a plane, length L2 of the conductor from central conductor 10 to insulating hole 40 can be made smaller, and VSWR can be further improved.

Figure 2A:
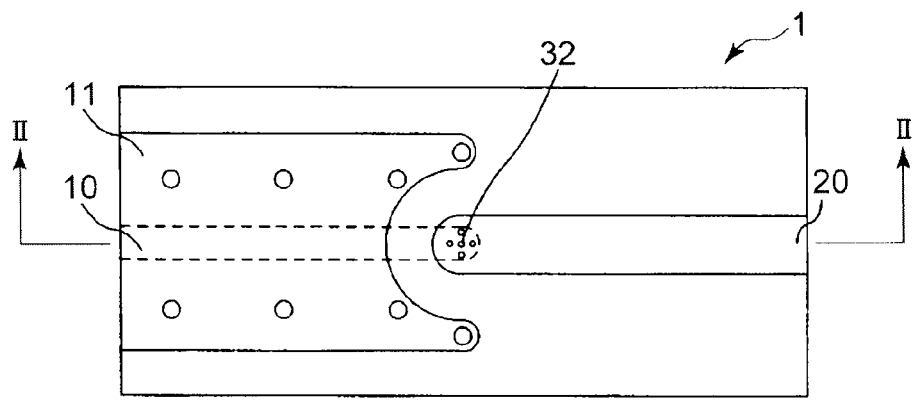
FIG. 2A is a top view of a radio frequency multilayer substrate of an embodiment in which a plurality of through-holes are provided in a central conductor of a microstrip line.
Figure 2B:
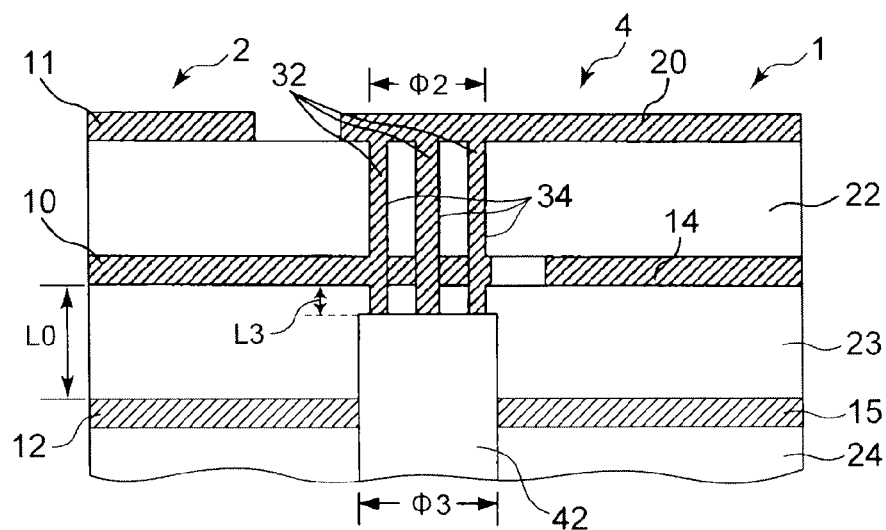
FIG. 2B is an enlarged cross-sectional view along II-II line of FIG. 2A.

FIG. 2A and FIG. 2B show radio frequency multilayer substrate 1 according to another embodiment. FIG. 2A is a top view of radio frequency multilayer substrate 1. FIG. 2B shows an enlarged cross-sectional view along II-II line in FIG. 2A.

Radio frequency multilayer substrate 1 has a plurality of through-holes 32 which electrically connect central conductor 10 of strip line 2 and central conductor 20 of microstrip line 4. Insulating hole 42 is formed to include all through-holes 32.

When forming insulating hole 42 by cutting, diameter $\phi 3$ of insulating hole 42 is larger than the longest distance $\phi 2$ between through-holes 32. If $\phi 3$ is smaller than $\phi 2$, conductor 34 of through-hole 32 may not be removed.

Also when being cut in this way, length L3 of conductor 34 from central conductor 10 to insulating hole 42 is made smaller than one half of distance L0 from central conductor 10 to 2nd ground conductor 12. If L3 is made larger than one half of L0, the unnecessary stray capacitance may occur.

Figure 2C:
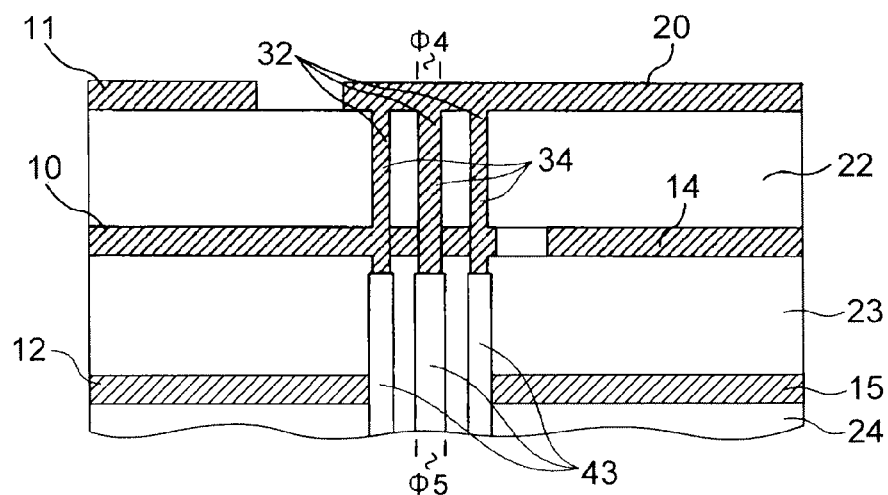
FIG. 2C is an enlarged cross-sectional view showing an example of an insulating hole.

FIG. 2C is an enlarged cross-sectional view showing an example in which insulating holes 43 are formed for every through-holes 32.

When forming insulating hole 43 by cutting, diameter φ5 of each insulating hole 43 is larger than diameter φ4 of each through-hole 32. If φ5 is smaller than φ4, conductor 34 of through-hole 32 may not be removed.

Figure 3:
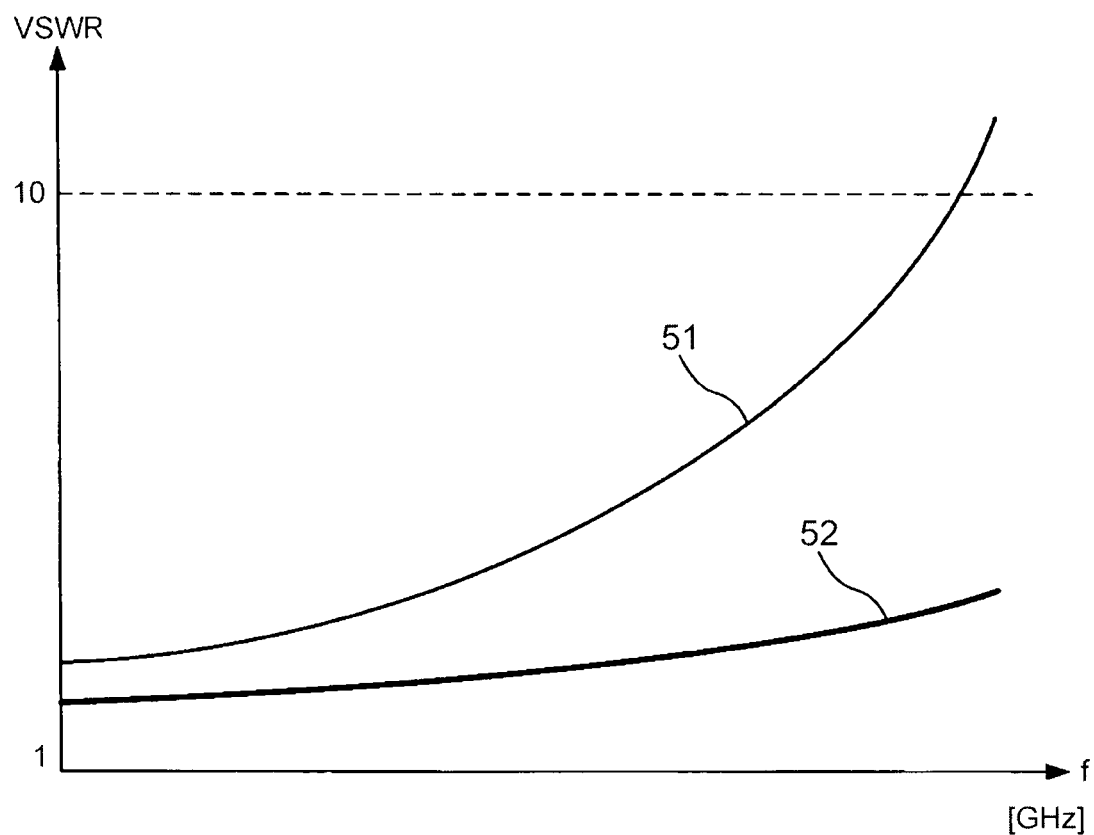
FIG. 3 is a graph which compares and shows the VSWR of a conventional radio frequency multilayer substrate and the VSWR of the radio frequency multilayer substrate of the embodiment.
Figure 4A:
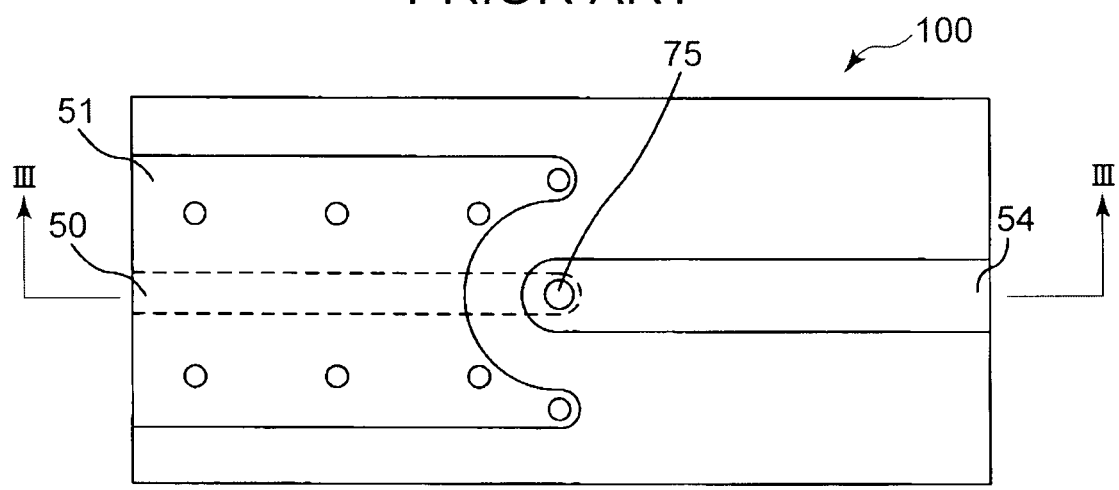
FIG. 4A is a top view of the radio frequency multilayer substrate utilizing conventional technology.
Figure 4B:
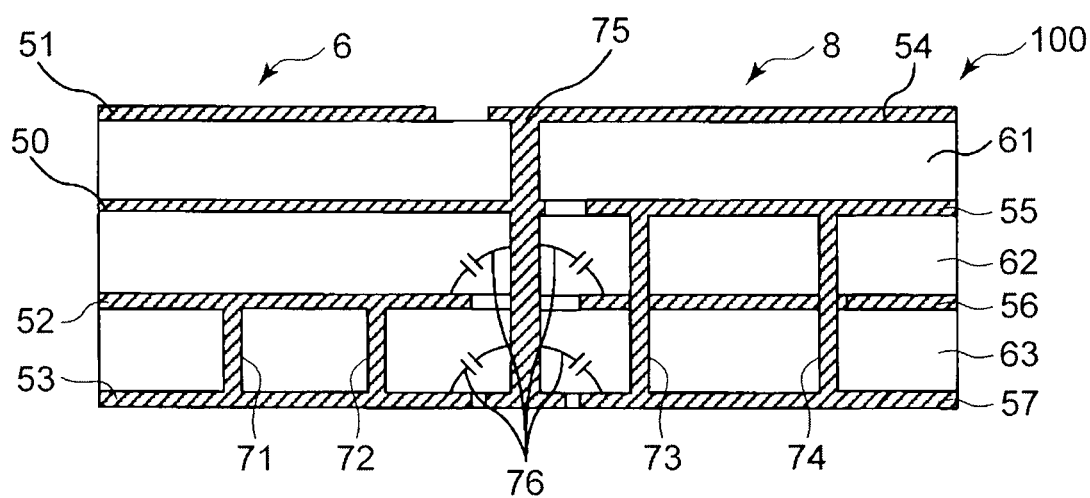
FIG. 4B is a cross-sectional view along III-III line of FIG. 4A.

FIG. 3 shows a graph which compares and shows VSWR of conventional radio frequency multilayer substrate 100 and VSWR of radio frequency multilayer substrate 1 of the embodiment. Curve 51 shows VSWR of conventional radio frequency multilayer substrate 100. When utilizing conventional radio frequency multilayer substrate 100 with a high frequency, VSWR deteriorates rapidly.

Curve 52 shows VSWR of radio frequency multilayer substrate 1 of the embodiment. When utilizing the radio frequency multilayer substrate 1 of the embodiment with high frequency, VSWR does not worsen badly.

Next, with reference to FIG. 1A and FIG. 1B, a manufacturing method of radio frequency multilayer substrate 1 of the embodiment in which insulating hole 40 is formed by cutting is explained.

First, ground conductors 11, 12, 13, 14, 15 and 16, dielectric layers 22, 23 and 24, central conductor 10 of strip line 2, and central conductor 20 of microstrip line 4 are laminated, and the multilayer substrate which has strip line 2 and microstrip line 4 is formed. The multilayer substrate is formed so that central conductor 20 may be located on the surface of the multilayer substrate and central conductor 10 may be located in a different layer from central conductor 20.

Second, penetration hole 33 which penetrates central conductor 10 of strip line 2, central conductor 20 of microstrip line 4, and dielectric layers 22, 23 and 24.

Third, conductor 34 which electrically connects central conductor 10 of strip line 2 and central conductor 20 of microstrip line 4 is formed in this penetration hole 33.

Furthermore, from a surface of the multilayer substrate which counters a surface on which central conductor 20 of microstrip line 2 is formed, conductor 34 provided in penetration hole 33 is cut and removed to form insulating hole 40. In this case, conductor 34 is cut and removed in a range which the tip of insulating hole 40 does not intersect central conductor 10. As for the length of conductor 34 from central conductor 10 to insulating hole 40, it is desirable that the length is smaller than one half of the distance from central conductor 10 to ground conductor 12.

As stated above, the radio frequency multilayer substrate of the embodiment is provided with the insulating hole which connects with the through-hole connecting central conductor 10 of strip line 2 and central conductor 20 of microstrip line 204 electrically, and which does not have a conductor inside thereof. For this reason, VSWR improves at the connection of the strip line and the microstrip line.

In the embodiment, one ground conductor 11 of strip line 2 and central conductor 20 of microstrip line 4 are formed on principal surface 221 of dielectric layer 22. However, the strip line is not restricted to this structure. For example, the radio frequency multilayer substrate may be formed by incorporating additional dielectric layers, and the strip line may be formed among the dielectric layers.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A radio frequency multilayer substrate, comprising:
a plurality of laminated dielectric layers;
a 1st central conductor provided between said plurality of dielectric layers and having a 1st principal surface and a 2nd principal surface, said 1st principal surface facing a surface of said plurality of laminated dielectric layers;
a 1st ground conductor facing said 1st principal surface of said 1st central conductor via said dielectric layer;
a 2nd ground conductor facing said 2nd principal surface of said 1st central conductor via said dielectric layer;
a 2nd central conductor formed on said surface of said plurality of laminated dielectric layers;
a 3rd ground conductor facing said 2nd central conductor formed among said plurality of dielectric layers;
a through-hole penetrating said dielectric layer between said 1st central conductor and said 2nd central conductor and having a conductor electrically connecting said 1st central conductor and said 2nd central conductor; and
an insulating hole connected with said through-hole and formed in said laminated dielectric layer, and an end face of said insulating hole being a plane;
wherein said insulating hole is formed by cutting said conductor of said through-hole, an inside diameter of said insulation hole is larger than the diameter of said through-hole, said through-hole has a plurality of through-holes, and said insulating hole includes all said plurality of through-holes.

2. A radio frequency multilayer substrate, comprising:
a plurality of laminated dielectric layers;
a 1st central conductor provided between said plurality of dielectric layers and having a 1st principal surface and a 2nd principal surface, said 1st principal surface facing a surface of said plurality of laminated dielectric layers;
a 1st ground conductor facing said 1st principal surface of said 1st central conductor via said dielectric layer;
a 2nd ground conductor facing said 2nd principal surface of said 1st central conductor via said dielectric layer;
a 2nd central conductor formed on said surface of said plurality of laminated dielectric layers;
a 3rd ground conductor facing said 2nd central conductor formed among said plurality of dielectric layers;
a through-hole penetrating said dielectric layer between said 1st central conductor and said 2nd central conductor and having a conductor electrically connecting said 1st central conductor and said 2nd central conductor; and
an insulating hole connected with said through-hole and formed in said laminated dielectric layer, and an end face of said insulating hole being a plane;
wherein said insulating hole is formed by cutting said conductor of said through-hole, an inside diameter of said insulation hole is larger than the diameter of said through-hole, said through-hole has a plurality of through-holes, and said insulating hole has a plurality of insulating holes provided to each of said plurality of through-holes.

* * * * *